July 23, 1963 R. A. GESHNER 3,098,950

ENCAPSULATED ELECTRIC COMPONENT ASSEMBLY

Filed Jan. 13, 1959

INVENTOR
R. A. GESHNER
BY A. C. Schwarz, Jr.
ATTORNEY

United States Patent Office 3,098,950
Patented July 23, 1963

3,098,950

ENCAPSULATED ELECTRIC COMPONENT ASSEMBLY

Robert A. Geshner, Rochester, N.Y., assignor to Western Electric Company, Incorporated, New York, N.Y., a corporation of New York Filed Jan. 13, 1959, Ser. No. 786,523
1 Claim. (Cl. 317—101)

This invention relates to an encapsulated electric component assembly, and more particularly to such an assembly including electrical components and interconnecting printed circuitry in a single encapsulation.

In the assembling of electrical components to printed circuit boards it is necessary to electrically connect certain leads of the electrical components to respective points on the printed circuit of the board to provided a sturdy, reliable and protected assembly. In the past this was attempted by first, individually soldering each component lead directly to the printed circuit and then encapsulating the individually mounted components and the printed circuit. A procedure of this sort resulted in irregularities in successively produced circuit assemblies and did not coextensively provide strength, protection from the atmosphere, versatility and dependability in the resulting circuit assemblies. It is therefore important to provide an assembly including positively positioned components and interconnecting printed circuitry embodied in a quickly formed, strong, air tight, encapsulation.

It is the primary object of this invention to provide a new assembly of electrical components interconnected by printed wiring, and embodied in a single encapsulation, A further object is the provision of an encapsulated electrical component assembly incorporating insulative blocks having stepped recesses.

With these and other objects in view, this invention contemplates an encapsulated electrical component assembly including a first insulative block having a stepped recess and a plurality of slots in and extending to the edges of the opposite walls thereof. A plurality of components are positioned on and between the steps of the recess so that the upper surfaces of the components form an upward concavity and the leads of the components are supported by the slots. A plurality of additional electrical components are positioned within this concavity and extend beyond the first block. A second insulated block also having a stepped recess and a plurality of slots in and extending to the edge of the opposite walls thereof is positioned on the first block, the components in the stepped recess serving to align the slots in the first and second blocks and provide free access to the recesses in the blocks through the aligned slots. A pair of printed circuit boards having conductive apertures therein are mounted on the leads of the components so as to provide a passageway between the boards and the blocks. An encapsulating material is introduced around the boards, within the passageways, the slots, and the recesses for encapsulating the assembly while leaving the leads of said components exposed. The assembly thus formed is then completely encapsulated in a single insulative material to seal the assembly and directly support the electrical components and the printed circuit boards.

Other objects, advantages and novel aspects of the invention will become apparent upon consideration of the following detailed description, in conjunction with the accompanying drawing wherein.

Figures 1, 2, 3, 4, 5, 6, 7, 8:
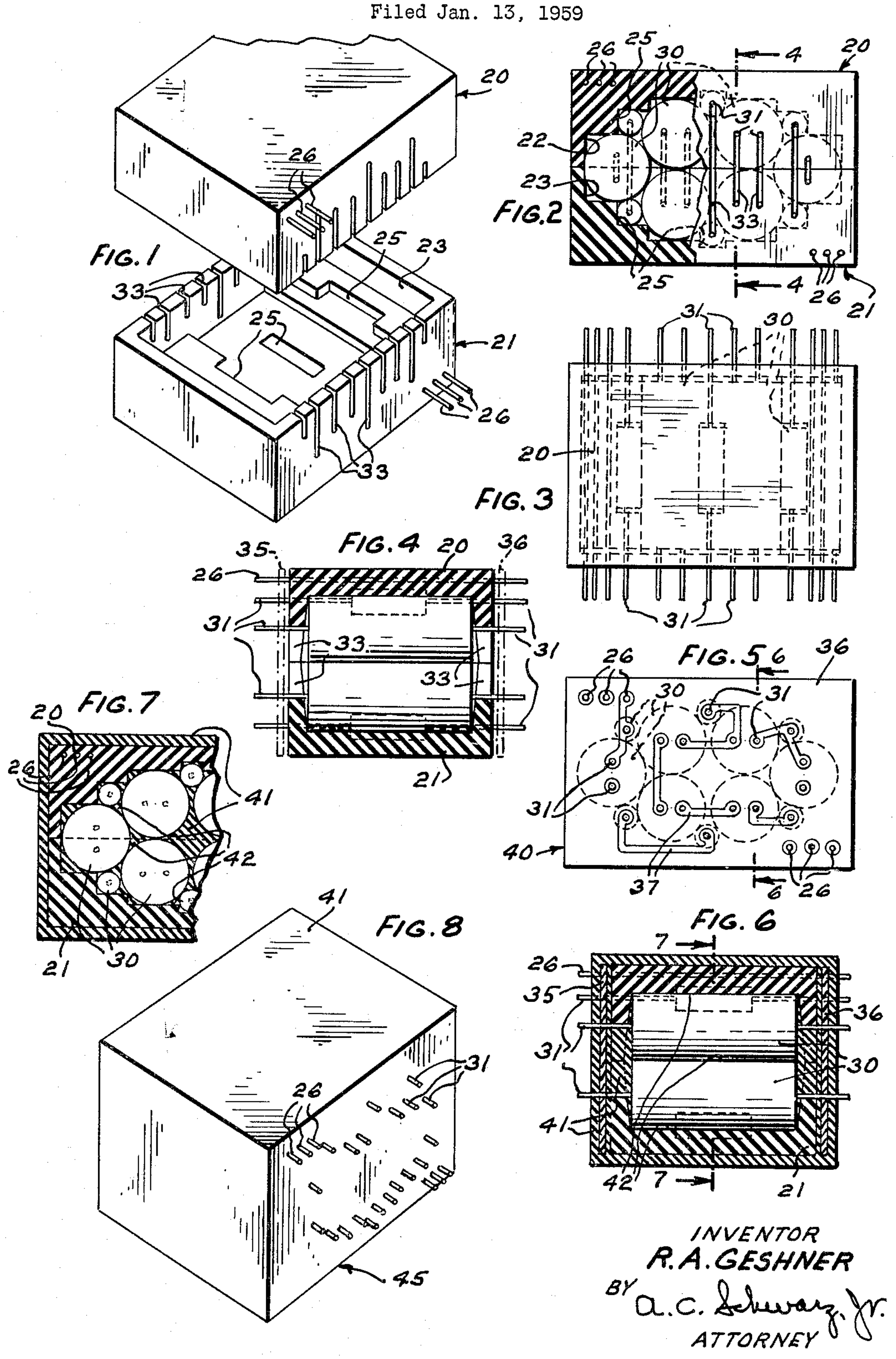
FIG. 1 is a perspective view of the insulative component positioning blocks showing the recesses and slots therein adapted to receive the electrical components and the respective leads thereof.
FIG. 2 is a front view of the insulative component positioning blocks showing the components positioned within the recesses of the blocks.
FIG. 3 is a top view of the component positioning blocks and components showing the components positioned therein and the component leads extending through the slots in the blocks.
FIG. 4 is a cross-sectional view along line 4—4 of FIG. showing the eventual position of the printed circuit boards in phantom lines.
FIG. 5 is a side view of the assembly of FIG. 3 showing the printed circuit boards placed on the component leads.
FIG. 6 is a cross-sectional view taken along line 6—6 of FIG. 5 showing the relative position of the positioning blocks, electrical components therein and the printed circuit boards encapsulated within an outer encapsulating material.
FIG. 7 is a partial cross-sectional view along line 7—7 of FIG. 6 showing the electrical components supported from within the positioning blocks by the encapsulating material.
FIG. 8 is a perspective view of the finished encapsulated assembly showing only the leads and conductors projecting therefrom.

Referring to FIGS. 1 and 2 there is shown a pair of positioning blocks indicated generally by the numerals 20 and 21 made of plastic or other insulating material which have completmenting recesses 22 and 23. Within the recesses 22 and 23 there are smaller recesses 25 for locating electrical components 30 within the larger recesses of the blocks 20 and 21. The blocks 20 and 21 each have electrical conductor elements 26 embedded therein which strengthen the blocks in addition to acting as electrical conductors. Leads 31 of the electrical components 30 are slidable in slots 33 in the walls of the positioning blocks 20 and 21. The walls of the blocks 20 and 21, adjacent the recesses 22 and 23 which have the slots 33 therein, are tapered as shown in FIG. 4 to facilitate, among other things, insertion of the electrical components 30 within the complementing recesses 22 and 23 of the blocks 20 and 21.

Printed circuit boards 35 and 36 (FIGS. 5 and 6) are positioned on the leads 31 of the electrical components 30 and on the conductor elements 26 adjacent to the positioning blocks 20 and 21. The printed circuit boards 35 and 36 thus hold the components 30 and blocks 20 and 21 in position as illustrated in FIGS. 4 and 6 to form an assembly 40.

A plastic or other insulative material 41 (FIGS. 6, 7 and 8) is used in a vacuum or a vacuum and pressure encapsulating process to completely encapsulate the assembly 40 and to force the encapsulating material into the interstices between the electrical components 30 and between the electrical components 30 and the positioning and holding members 20, 21, 35, 36 to directly support the electrical components within the insulating blocks at 42. The completely encapsulated electrical components and circuitry are shown in FIG. 8.

To form the encapsulated circuitry the components 30 are first placed within the positioning blocks in the complementing recesses 22 and 23 thereof and are further accurately supported in predetermined positions therein by the smaller recesses 25. The leads 31 of the components 30 are positioned in the slots 33 in the positioning blocks 20 and 21 so that the leads 31 will be maintained in a predetermined pattern which is determined by the blocks 20 and 21.

With the components 30 positioned within the complementing positioning blocks 20 and 21 and with the leads extending from the slots 33 thereof, apertured printed circuit boards 35 and 36 are placed over the respective leads 31 and conductor elements 26 and spaced from the blocks 20 and 21 to form a passageway between the blocks 20 and 21 and the boards 35 and 36, respectively, as shown in FIGS. 4 and 6. The printed circuit boards 35 and 36 thereby maintain the blocks 20 and 21 and the electrical components in a predetermined pattern to form the assembly 40 with a desired circuitry (FIG. 5). The leads 31 and the conductors 26 can thereupon be soldered to the circuitry 37 on the printed circuit boards 35 and 36 to make the assembly 40 rigid and to provide positive electrical contact between the component connectors and the circuitry 37 of the printed circuit boards 35 and 36.

The assembly 40 is then cast in a plastic or other insulating material 41 under a vacuum to completely encapsulate the assembly 40, as shown in FIG. 8. The assembly is so encapsulated as to leave only the leads 31 and conductors 26 exposed. By applying a vacuum to the assembly in casting the plastic or other insulating material 41 the casting material 41 will flow around the printed circuit boards 35 and 36 and through the passageway formed between the positioning blocks 20 and 21 and the boards 35 and 36 to enter the interstices of the assembly to directly and rigidly support the electrical components 30 within the positioning blocks 20 and 21. The result is a completely encapsulated circuit assembly wherein the elements thereof are rigidly supported at all times to insure proper relationship therebetween and to provide an assembly protected against shock and corrosion (FIG. 8).

It is to be understood that the above-described arrangements are simply illustrative of the application of the principles of this invention. Numerous other arrangements may be readily devised by those skilled in the art which will embody the principles of the invention and fall within the spirit and scope thereof.

What is claimed is:

An encapsulated electrical component assembly comprising a first insulative block having a stepped recess and a plurality of slots in and extending to the edges of opposite walls thereof, a plurality of components positioned on and between the steps so that the upper surfaces of said components form an upward concavity and the leads of said components are supported by the slots, a plurality of additional components positioned within said concavity and extending beyond said first block, a second insulative block having a stepped recess and a plurality of slots in and extending to the edges of opposite walls thereof, said second block being positioned on the first block by the components in the stepped recess to align slots in the second insulative block with slots in the first insulative block to cooperate in providing free access to the recesses within said insulative blocks, a pair of printed circuit boards having conducting apertures through which the leads of said components are inserted, said printed circuit boards being mounted on said leads to form a passageway between said boards and blocks, and an encapsulating material positioned around the boards and within the passageways, the slots, and the recesses for encapsulating the assembly while leaving the leads of said components exposed.

References Cited in the file of this patent

UNITED STATES PATENTS

| | | |
|---|---|---|
| 2,176,604 | Benkelman | Oct. 17, 1939 |
| 2,821,669 | Christian | Jan. 28, 1958 |
| 2,836,772 | Wintrode | May 27, 1958 |
| 2,850,681 | Horton | Sept. 2, 1958 |
| 2,857,558 | Fiske | Oct. 21, 1958 |
| 2,862,992 | Franz | Dec. 2, 1958 |
| 2,870,728 | Goodykoontz | Jan. 27, 1959 |
| 2,871,549 | Arnold | Feb. 3, 1959 |
| 2,877,544 | Gammel | Mar. 17, 1959 |
| 2,911,572 | Francis et al. | Nov. 3, 1959 |